(12) United States Patent
Bianchini

(10) Patent No.: US 7,729,130 B1
(45) Date of Patent: Jun. 1, 2010

(54) TRANSCEIVER MODULE WITH COLLAPSIBLE FINGERS THAT FORM A SEALED EMI SHIELD

(75) Inventor: Gioni Bianchini, Sunol, CA (US)

(73) Assignee: Fourte Design & Development LLC, Sunol, CA (US)

( * ) Notice: Subject to any disclaimer, the term of this patent is extended or adjusted under 35 U.S.C. 154(b) by 708 days.

(21) Appl. No.: 11/649,110

(22) Filed: Jan. 2, 2007

(51) Int. Cl.
*H05K 9/00* (2006.01)
(52) U.S. Cl. .................. 361/816; 361/818; 361/800
(58) Field of Classification Search ......... 361/799–800, 361/816, 818; 174/35 R, 51, 250–255
See application file for complete search history.

(56) References Cited

U.S. PATENT DOCUMENTS

| | | | | |
|---|---|---|---|---|
| 5,365,410 | A * | 11/1994 | Lonka | 361/816 |
| 6,534,706 | B1 * | 3/2003 | Rapp et al. | 174/354 |
| 6,780,053 | B1 * | 8/2004 | Yunker et al. | 439/607.2 |
| 7,488,902 | B2 * | 2/2009 | English et al. | 174/382 |
| 7,504,592 | B1 * | 3/2009 | Crotty, Jr. | 174/372 |
| 7,511,230 | B2 * | 3/2009 | Cochrane | 174/382 |
| 2007/0117458 | A1 * | 5/2007 | Winker et al. | 439/607 |

OTHER PUBLICATIONS

"Irregular." Definition from the Merriam-Webster Online Dictionary. http://www.merriam-webster.com/dictionary/irregular. Accessed on Dec. 10, 2009.

* cited by examiner

*Primary Examiner*—Hung S Bui
(74) *Attorney, Agent, or Firm*—Carr & Ferrell LLP

(57) ABSTRACT

An EMI shield for a transceiver module includes a plurality of collapsible fingers that allow the shield to be sealed at the corners when the transceiver is inserted into a receiving cage. The fingers of the shield are made with a designed interference with the cage, so that the fingers are compressed when the module is inserted into the cage. A pattern of peaks and valleys on the fingers bordering the corners of the shield allows the two adjacent fingers to mesh when the module is inserted into the cage. The meshing of the peaks-and-valleys pattern of the bordering fingers allows the shield to be sealed with a gap width under 0.015".

4 Claims, 3 Drawing Sheets

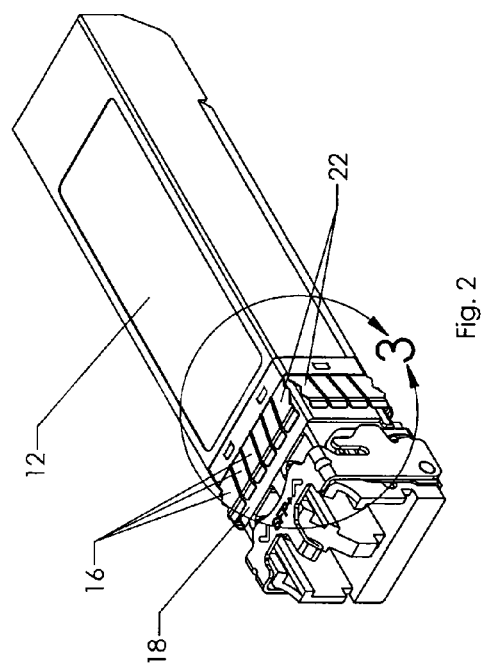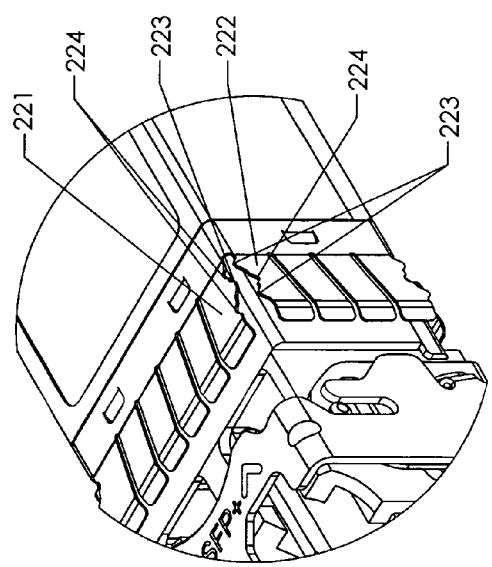

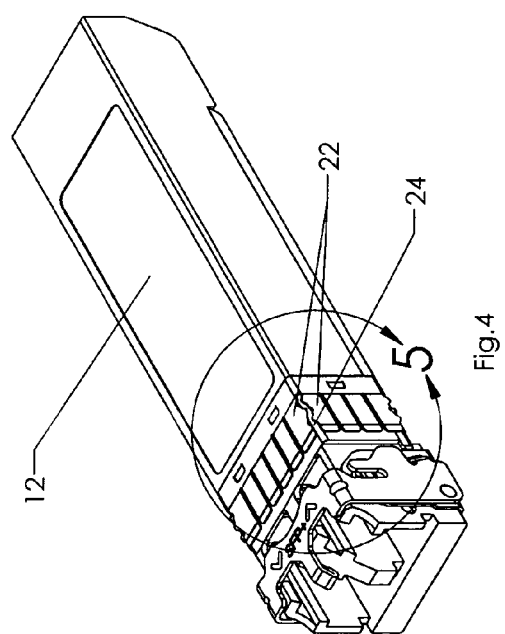
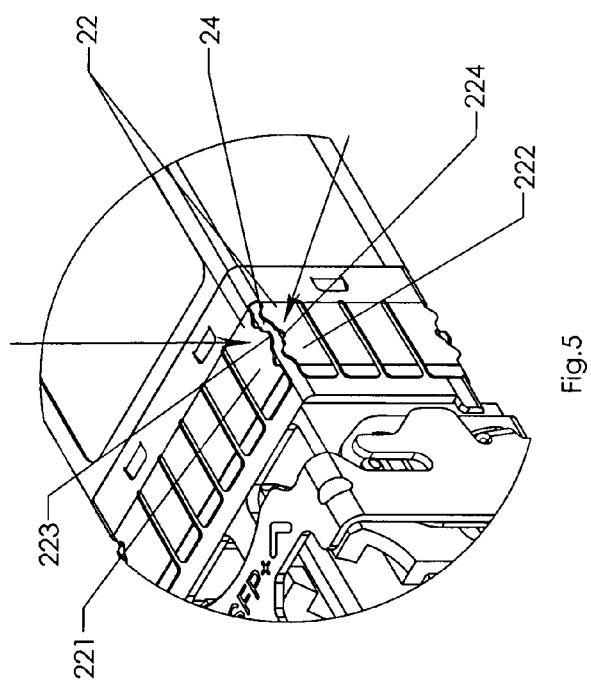

TRANSCEIVER MODULE WITH COLLAPSIBLE FINGERS THAT FORM A SEALED EMI SHIELD

BACKGROUND OF THE INVENTION

1. Field of the Invention

The present invention relates generally to transceiver modules, and more particularly is a transceiver module with an EMI shield that is sealed when the module is inserted into a cage mounted on a PC board.

2. Description of the Prior Art

Computers and related peripheral equipment, and satellite and communication systems, have in the recent past evolved extremely rapidly. These systems require ever increasing data transfer rates to perform the highly complex tasks that drive the systems, such as digital signal processing, image analysis, and communications. With current demands, optical couplers are used to transfer signals over short and long distances between computers, between two circuit boards in one computer, and even between multiple chips on a single printed circuit board. The use of high speed optical signals in place of electrical interconnections increases the achievable data transfer rate.

An optical transmitter/receiver module typically includes both light emitting devices such as vertical cavity surface emitting lasers (VCSELs) and light detecting devices such as photodiodes. Driver/receiver circuitry modules, typically in the form of application specific integrated circuit (ASIC) chips, include driver circuitry which receives electrical signals from one device and drives the VCSELs in response. The ASIC also includes receiver circuitry for receiving signals from the photodiodes and, in response, for processing those signals into an appropriate output. The combination of the VCSELs, the photodiodes, and the ASIC circuitry is commonly referred to as an optical transceiver or a fiber optic transceiver.

To provide heat dissipation means and EMI (electro-magnetic interference) protection for the circuitry of the transceivers, the transceivers are enclosed in packages called modules. The main subject of this invention is the IPF module that includes, per MSA (Multi Source Agreement) standards, an EMI dissipation means at the mouth of the cage receiving the module.

The problem presented by the EMI shield is that the shield must wrap around the rectangular module. This presents four edge areas that are very difficult to cover with a stamped sheet metal EMI shield. The stamping process requires some boundary distance between the fingers and the edge of the base of the shield. With ordinary straight projecting fingers in the shield, an unacceptably large gap is created in the EMI shield at each of its corners.

Accordingly, it is an object of the present invention to provide a means to form an EMI shield at the mouth of the cage receiving a transceiver.

It is another object of the present invention to provide an EMI shield that forms sealed corners when the transceiver is inserted into the cage.

SUMMARY OF THE INVENTION

The present invention is an EMI shield for a transceiver module. The EMI shield has a unique architecture that allows the shield to be sealed at the corners when the transceiver is inserted into a receiving cage. The shield comprises a plurality of collapsible fingers that are installed around the perimeter of the front portion of the module, the portion that is contained in the mouth of the cage receiving the module. The fingers of the shield are made with a designed interference with the cage, so that the fingers are compressed when the module is inserted into the cage. A pattern of peaks and valleys on the fingers bordering the corners of the shield allows the two adjacent fingers to mesh when the module is inserted into the cage. The meshing of the peaks-and-valleys pattern of the bordering fingers allows the shield to be sealed with a gap width under 0.015".

An advantage of the present invention is that the material for the EMI shield can be manufactured via a sheet metal stamping process.

Another advantage of the present invention is that a superior EMI shield is formed with corner gap widths under 0.015".

These and other objects and advantages of the present invention will become apparent to those skilled in the art in view of the description of the best presently known mode of carrying out the invention as described herein and as illustrated in the drawings.

BRIEF DESCRIPTION OF THE DRAWINGS

FIG. 2 is a perspective view showing the module with the EMI fingers in a relaxed state.

FIG. 3 is a detail view of the area circled in FIG. 2.

FIG. 4 is a perspective view showing the module with the EMI fingers in a compressed state.

FIG. 5 is a detail view of the area circled in FIG. 4.

DETAILED DESCRIPTION OF THE INVENTION

Figure 1:
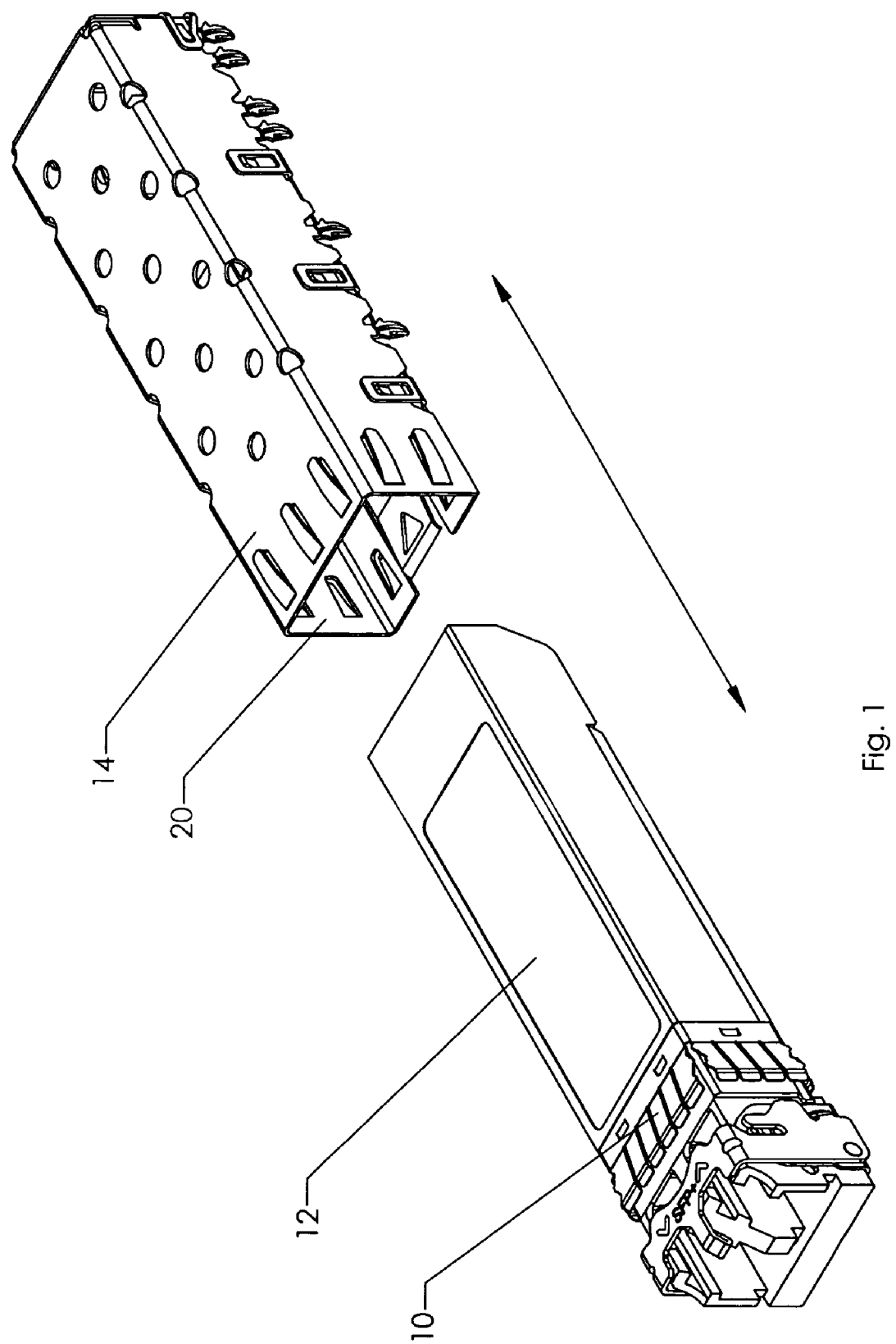
FIG. 1 is a perspective view of a transceiver module in position to be inserted into a receiving cage.

The present invention is an EMI shield 10 for a transceiver module 12. The transceiver module 12 is received in a cage 14 mounted on a PCB (not shown). The EMI shield 10 comprises a plurality of flexible fingers 16 that are mounted around the entire perimeter of the front portion 18 of the module 12. The front portion 18 of the transceiver module 12 is that portion that is surrounded by the mouth 20 of the cage 14 when the module 14 is in the installed position. In all applications, this area need to be protected by EMI shielding.

In the preferred embodiment, each finger 16 comprises a base 161 that is attached to the module 12. The fingers 16 extend slightly away from the body of the module 12 so that an interference fit with the cage 14 is created. A free end 162 of each finger 16 is angled downward to ensure that the fingers 16 do not catch on the mouth 20 of the cage 14 when the transceiver module 12 is inserted into the cage 14.

Referring now chiefly to FIGS. 3 and 5, a critical feature of the fingers 16 of the EMI shield 10 of the present invention is the contour of the edges of each pair of fingers 22 adjacent the corners of the module 12. A first adjacent finger 221 and a second adjacent finger 222 each have an irregular contour with at least one peak 223 and at least one valley 224. The peaks 223 protrude relative to the connected edge of the base 161 of the adjacent fingers 221, 222. In the preferred embodiment, the valleys 224 are depressed slightly. The contour of each peak 223 and valley 224 on the first adjacent finger 221 mirrors a corresponding valley 224 and a corresponding peak 223 on the second adjacent finger 222. The pattern of peaks 223 and valleys 224 on the adjacent fingers 22 of the shield 10 allows the two adjacent fingers 22 to mesh when the module 10 is inserted into the cage 14. When the EMI shield 10 of the present invention is in the compressed position shown in FIG. 5, the fingers 16 are collapsed to form an enclosure with all gaps between adjoining fingers 16, including corner gaps 24, measuring less than 0.015". An EMI Shield formed with conventional straight fingers adjacent the corner gaps cannot achieve this dimension. The EMI shield 10 of the present invention with corner gaps 24 measuring less than 0.015" provides superior EMI protection.

Comparing now FIGS. 2 and 3 with FIGS. 4 and 5, the dynamic sealing aspect of the EMI shield 10 can readily understood. The fingers 16 of the shield 10 are manufactured with a designed interference with the cage 14. The fingers 16 in FIGS. 2 and 3 are shown in the relaxed state, before the transceiver module 12 is inserted into the cage 14. When the module 12 is inserted, the fingers 16 (including corner adjacent finger pairs 22) are compressed by the cage mouth 20. The compressed state of the fingers 16 is shown in FIGS. 4 and 5. When the corner pairs 22 are compressed, the corner gaps 24 are reduced in size, forming an effectively sealed EMI shield.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

I claim:

1. An EMI shield for a transceiver module, the EMI shield comprising:
a plurality of compressible fingers extending away from the transceiver module to form an interference fit with a receiving cage, wherein edges of at least one pair of fingers adjacent a corner of the transceiver module have an irregular contour, adjacent edges of the at least one pair of fingers adjacent the corner coming into close proximity with one another when the fingers are compressed as the transceiver module is inserted into the cage thereby forming a narrow corner gap.

2. The EMI shield of claim 1:
wherein the irregular contour includes at least one peak extending outward relative to a longitudinal centerline of a respective finger and at least one valley extending inward relative to the peak, a contour of each peak and valley on a first adjacent finger mirroring a corresponding valley and a corresponding peak on a second adjacent finger.

3. The EMI shield of claim 2, wherein the irregular contour is curvilinear.

4. The EMI shield of claim 1, wherein the irregular contour is curvilinear.

* * * * *